United States Patent [19]

Mohammad

[11] Patent Number: 5,365,089
[45] Date of Patent: Nov. 15, 1994

[54] DOUBLE HETEROJUNCTION BIPOLAR TRANSISTOR AND THE METHOD OF MANUFACTURE THEREFOR

[75] Inventor: S. Noor Mohammad, Hopewell Junction, N.Y.

[73] Assignee: International Business Machines Corporation, Armonk, N.Y.

[21] Appl. No.: 968,913

[22] Filed: Dec. 23, 1992

[51] Int. Cl.$^5$ .................. H01L 27/01; H01L 29/00; H01L 29/78
[52] U.S. Cl. .................. 257/195; 257/139; 257/200
[58] Field of Search ............ 257/195, 200, 139

[56] References Cited

U.S. PATENT DOCUMENTS

| | | | |
|---|---|---|---|
| 4,593,305 | 6/1986 | Kurata et al. | 357/34 |
| 4,617,724 | 11/1986 | Yokoyama et al. | 29/576 B |
| 4,649,411 | 3/1987 | Birrittella | 257/197 |
| 4,679,305 | 7/1987 | Morizuka | 29/576.3 |
| 4,751,195 | 6/1988 | Kawai . | |
| 4,768,074 | 8/1988 | Yoshida et al. | 357/34 |
| 4,794,440 | 12/1988 | Capasso et al. | 357/34 |
| 4,903,104 | 2/1990 | Kawai et al. | 357/35 |
| 4,996,166 | 2/1991 | Ohshima | 437/31 |
| 5,010,382 | 4/1991 | Katoh | 357/34 |
| 5,024,958 | 6/1991 | Awano | 437/31 |

OTHER PUBLICATIONS

H. Kroemer, "Theory of Wide-Gap Emitter for Transistors", Proc. IRE, vol. 45, pp. 1535-1537 (1957).
A. Das and M. S. Lundstrom, "Numerical Study of Emitter-Base Junction Design for AlGaAs/GaAs Heterojunction Bipolar Transistors," IEEE Trans. Electron Devices, vol. ED-35, pp. 863-870 (1988).
S. C. Lee and H. H. Lin, "Transport Theory of the Double Heterojunction Bipolar Transistor Based on Current Balancing Concept", J. Appl. Phys., vol. 59, pp. 1688-1695 (1986).
P. M. Enquist, L. P. Ramberg, L. F. Eastman, "Comparison of Compositionally Graded to Abrupt Emitter-Base Junctions Used in the Heterojunction Bipolar Transistor," J. Appl. Phys., vol. 61, pp. 2663-2669 (1987).
H. Kroemer, "Heterostructure Bipolar Transistors and Integrated Circuits" Proc. IEEE, vol. 70, pp. 13-25 (1982).
S. Noor Mohammad, J. Chen, J. I. Chyi, H. Morkoc, "Effect of Junction and Bandgap Grading on the Electrical Performance of Molecular Beam Epitaxial Grown AlGaAs/GaAs/AlGaAs Double-Heterojunction Bipolar Transistors," Jrnl. Appl. Phys., vol. 69, pp. 1067-1070 (1991).
R. L. Anderson, "Experiments in Ge-GaAs Heterojunctions," Solid-State Electron, vol. 3, pp. 341-351 (1962).

Primary Examiner—Andrew J. James
Assistant Examiner—Stephen D. Meier
Attorney, Agent, or Firm—Charles W. Peterson, Jr.

[57] ABSTRACT

A Double Heterojunction Bipolar Transistor (DHBT) and the method of fabrication therefor. First a layered wafer is prepared on a semi-insulating GaAs substrate. The bottom wafer layer is n+ GaAs, followed by n− AlGaAs, a thin layer of n AlGaAs (which form the DHBT's collector) and a base layer of p+ GaAS. A layered plug fills a trench etched in the base layer. The bottom two plug layers are AlGaAs and the top plug layer is GaAs. Next, an emitter is ion-implanted into the plug core and an extrinsic base region is ion-implanted. Finally, base, emitter and collector contacts are formed.

10 Claims, 7 Drawing Sheets

DOUBLE HETEROJUNCTION BIPOLAR TRANSISTOR AND THE METHOD OF MANUFACTURE THEREFOR

FIELD OF THE INVENTION

The present invention relates in general to a bipolar transistor and in particular to a double heterojunction bipolar transistor having both emitter-base and base-collector junctions from different semiconductor materials.

BACKGROUND OF THE INVENTION

Heterojunction Bipolar Transistors (HBTs) are known in the art. For example see U.S. Pat. No. 4,768,074 entitled, "Heterojunction Bipolar Transistor Having an Emitter Region with a Band Gap Greater than that of a Base Region" to Yoshida et al. Double Heterojunction Bipolar Transistors (DHBTs) and Double Heterojunction High Electron Transistors (DHETs) are known in the art. For example see U.S. Pat. No. 5,010,382 entitled "Heterojunction Bipolar Transistor Having Double Hetero Structure" to Katoh. DHBTs and DHETs (DHTs) have one heterojunction between the emitter and base region and a second between the base and collector region. DHTs have many advantages over other types of bipolar transistors, such as enhanced emitter injection efficiency, lower base resistance, and lower base-emitter junction capacitance ($C_{jbe}$).

Figure 1:
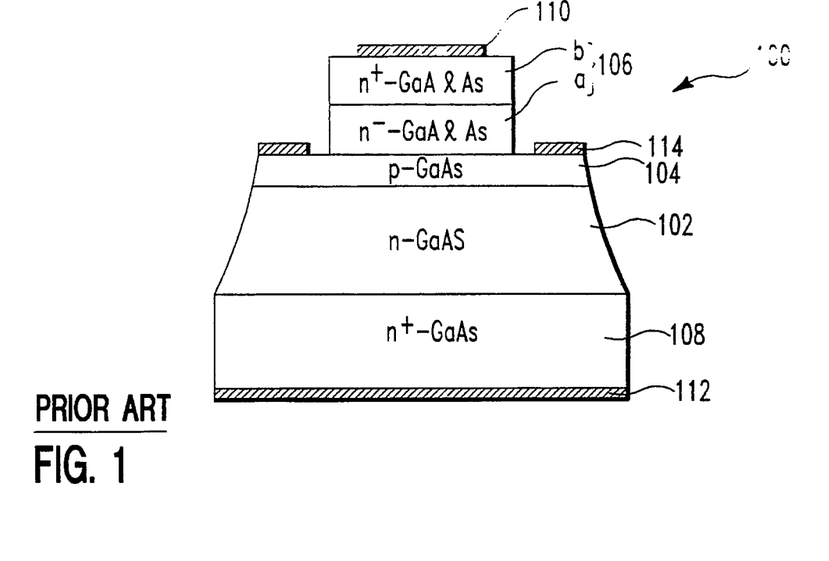
FIG. 1 is a cross sectional view of the prior art single heterojunction bipolar transistor.

FIG. 1 is a cross-sectional view of a prior art GaAs-AlGaAs HBT 100 structure. The HBT 100 has an n-type GaAs collector layer 102, a p-type GaAs base layer 104, and an n-type $Al_xGa_{1-x}As$ emitter 106 (x is the mole fraction of aluminum in AlGaAs) on an n+-GaAs substrate 108. The emitter 106 has two layers, a thick n−-type first emitter layer 106a on the base layer 104 and a thin n+-type second emitter layer 106b on the first emitter layer 106a and contacting emitter electrode 110. Collector electrode 112 contacts the sub-collector layer 108 and base electrode 114 contacts base layer 104.

The lower doping of first emitter layer 106a combined with its thickness reduces $C_{jeb}$ and increases the transistor's switching speed. To further improve transistor performance, the emitter and the collector current density must be at least $10^3$ to $1.0^4$ Amp/cm². For the prior art HBT of FIG. 1, the reduced doping concentration of the emitter layer 106a reduces carrier injection into the base from the emitter to slow transistor turn-on. Because of this low doping concentration, a high forward-bias voltage $V_{be}$ is applied to the base-emitter junction to increase current density. However, because of this increased $V_{be}$, excess carriers are stored in both the first emitter layer 106a and in collector layer 102. Consequently, the transistor's turn-off time $t_{off}$ increases. Since transistor switching speed is the average of $t_{on}$ and $t_{off}$, a large $t_{off}$ offsets a reduction in $t_{on}$ and, therefore, is unacceptable.

A heterojunction formed from dissimilar semiconductor materials causes a conduction band discontinuity or spike, $\Delta E_c$, and a valence band discontinuity $\Delta E_v$ at the interface of the two materials. $\Delta E_c$ blocks the injection of low-energy carriers from the emitter region into the base region degrading emitter efficiency and, consequently, switching speed. Prior art attempts, e.g., grading the heterojunction, have failed to solve this switching speed degradation problem. For example, see L. F. Eastman, P. M. Enquist, and L. P. Ramberg, "Comparison of Compositionally Graded to Abrupt Emitter-Base Junctions Used in Heterojunction Bipolar Transistor," Journal of Applied Physics, Volume 61, pps. 2663–2669, 1987.

Prior art HBTs and DHBTs also suffer from high junction leakage currents. Several factors contribute to junction leakage, including base electron-hole recombination and laterally diffused carriers-injected from the emitter into the extrinsic base. Consequently, HBTs have a lower current gain B than would otherwise be expected. Exacerbating this problem is the HBT $\beta$'s non-uniformity, and the further reduction of $\beta$ that results when HBT's are scaled. These problems compound each other, making HBTs unattractive for dense circuit integration.

PURPOSES OF THE INVENTION

It is a purpose of the present invention to reduce the parasitic capacitance between the base and the collector of Double Heterojunction Bipolar Transistors.

It is another purpose of the present invention to reduce base to emitter leakage in Double Heterojunction Bipolar Transistors.

It is still another purpose of the present invention to reduce base resistance in Double Heterojunction Bipolar Transistors.

It is still another purpose of the present invention to reduce lateral current diffusion between the emitter region and the extrinsic base region in Double Heterojunction Bipolar Transistors.

It is still another purpose of the present invention to improve the current gain efficiency of Double Heterojunction Bipolar Transistors.

It is still another purpose of the present invention to reduce parasitic capacitance, reduce base to emitter leakage, reduce base resistance and improve the current gain efficiency of Double Heterojunction Bipolar Transistors.

SUMMARY OF THE INVENTION

A Double Heterojunction Bipolar Transistor (DHBT) comprising: a first layer of a first semiconductor material; a second layer of a second semiconductor material; a third layer of said second semiconductor material; a fourth layer of said first semiconductor material; and a plug in said fourth layer.

BRIEF DESCRIPTION OF THE DRAWINGS

The preferred embodiment of the present invention as claimed in the appended claims and described in the following specification may be better understood with reference to the attached drawings wherein like reference numerals correspond to the same or similar elements and:

DETAILED DESCRIPTION OF THE PREFERRED EMBODIMENT

FIGS. 2A-2I represent the steps in fabricating a Double Heterojunction Bipolar Transistor (DHBT) according to a preferred embodiment of the present invention.

Figure 2A:
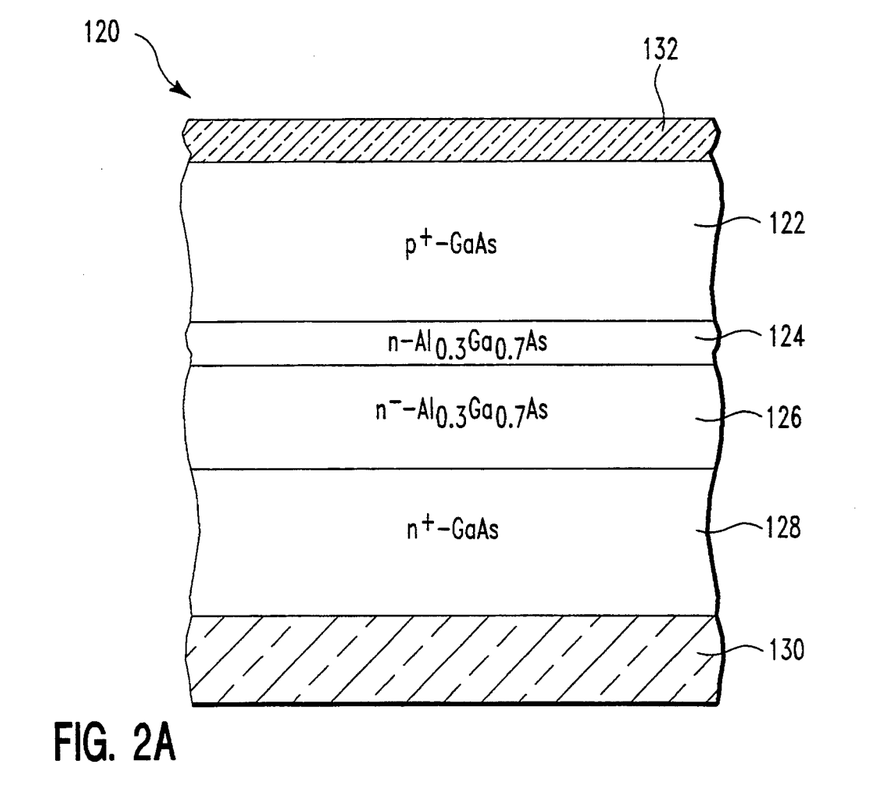
FIGS. 2A to 2I are steps in fabrication of a double heterojunction bipolar transistor according to the preferred embodiment of the present invention.
Figure 2B:
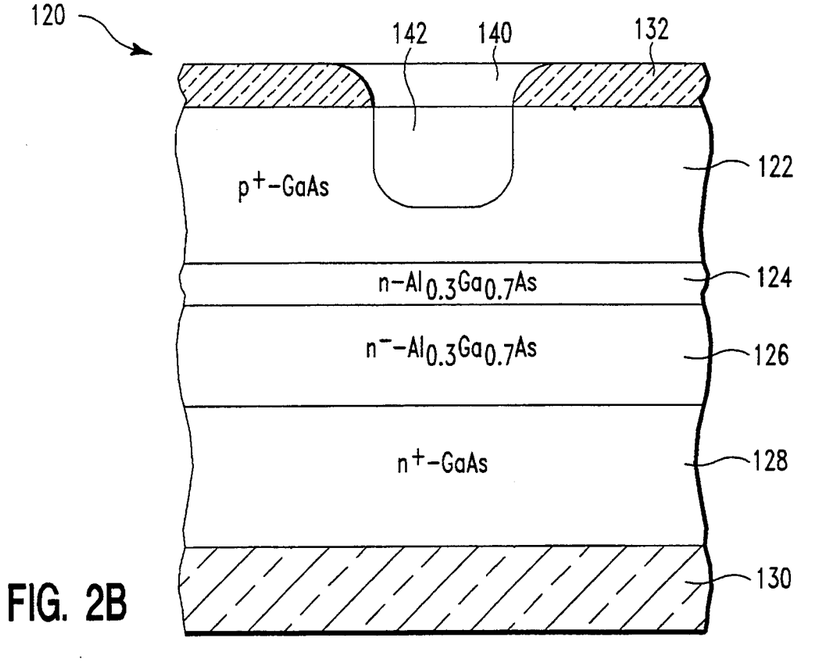

First, in FIG. 2A, the layers of the multilayer wafer 120 are grown by the Molecular Beam Epitaxy (MBE) method. The wafer 120 has a 0.2 $\mu$m p$^+$-GaAs first layer 122 doped to $10^9$/cm$^3$, on a 50-100 Å n-type Al$_{0.3}$Ga$_{0.7}$As second layer 124 doped to $10^{17}$/cm$^3$, on a 0.5 $\mu$m n$^{--}$-Al$_{0.3}$Ga$_{0.7}$As third layer 126 doped to $5 \times 10^{16}$/cm$^3$, and a 0.5 $\mu$m n$^+$-GaAs fourth layer 128 doped to $5 \times 10^{18}$/cm$^3$ on a Semi-insulating fifth layer 130. A 0.3 $\mu$m SiO$_2$ layer 132 is deposited on the wafer by the Chemical Vapor Deposit (CVD) or, alternatively, by a sputtering method.

Figure 2C:
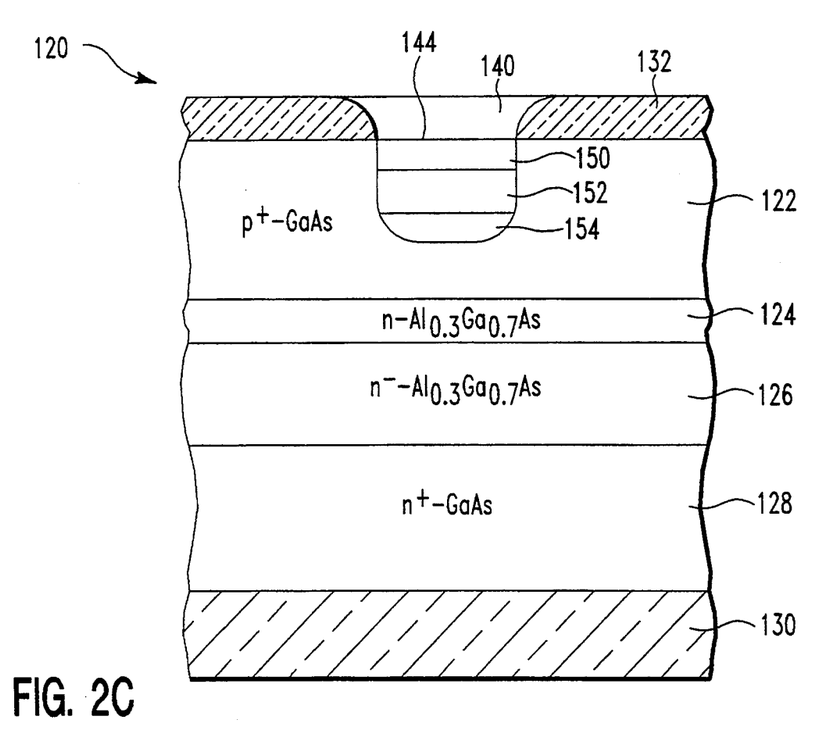

An emitter pattern is formed in photoresist using a conventional photoresist technique. The emitter's photoresist pattern provides an etch mask for etching the SiO$_2$ film 132. Area 140 is formed in the SiO$_2$ in FIG. 2B by reactive ion etching (RIE) with CF$_4$ gas as represented to expose the p$^+$-GaAs layer 122. Next, a 0.20 $\mu$m concave portion or trench 142 is etched into the exposed p$^+$-GaAs layer 122 by a selective dry etching method using an etchant gas mixture of carbon dichlorodifluoride CCl$_2$F$_2$ and helium (He). In FIG. 2C, after etching the concave portion 142, a tri-layered plug 144 of layers of n-GaAs and n-Al$_{0.3}$Ga$_{0.7}$As is selectively grown in the concave portion 142. The plug top layer 150 is a 0.05 $\mu$m thick n-type GaAs layer doped to $3 \times 10^{17}$ cm$^{-3}$. The middle plug layer 152 is a 0.10 $\mu$m n-type Al$_{0.3}$Ga$_{0.7}$As layer doped to $2 \times 10^{17}$ cm$^{-3}$. The bottom plus layer 154 is a 0.05 $\mu$m n-type Al$_{0.3}$Ga$_{0.7}$As layer doped to $10^{17}$ cm$^{-3}$. After growing these three plug layers using a Metal Oxide Chemical Vapor Deposition (MOCVD) method, any excess semiconductor on the SiO$_2$ layer 132 can be cleaned away with an etchant such as sulfuric acid.

Figure 2D:
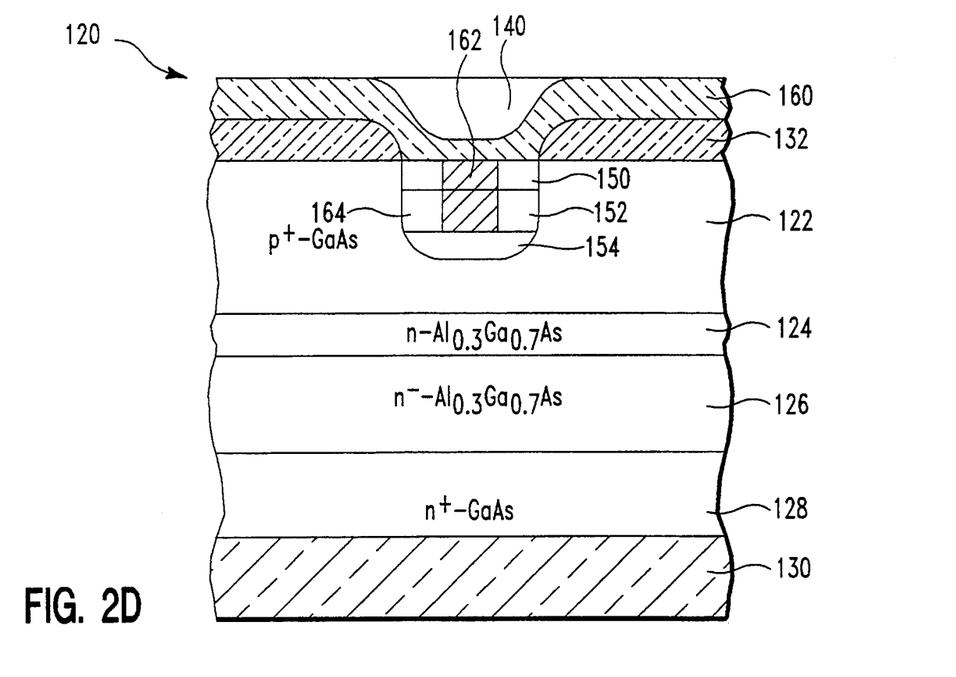

Next, a second SiO$_2$ layer 160 in FIG. 2D, 0.2 $\mu$m thick, is grown on the first SiO$_2$ layer 132, and covering top emitter layer 150 in opening 140. Si ions are blanket ion-implanted, penetrating the second SiO$_2$ layer 160, but blocked by the combined thickness of the first SiO$_2$ layer 132 and the second SiO$_2$ layer 160 (0.50 $\mu$m) So, Si ion-implantation is limited in the plug 144 to area 162 with limited Si implantation in those regions of 150 and 152 blocked by any SiOAl$_2$ thicker than the second layer 160 and, therefore, blocked outside of area 162. Further, the second layer 160 minimizes surface damage to top emitter layer 150.

Figure 2E:
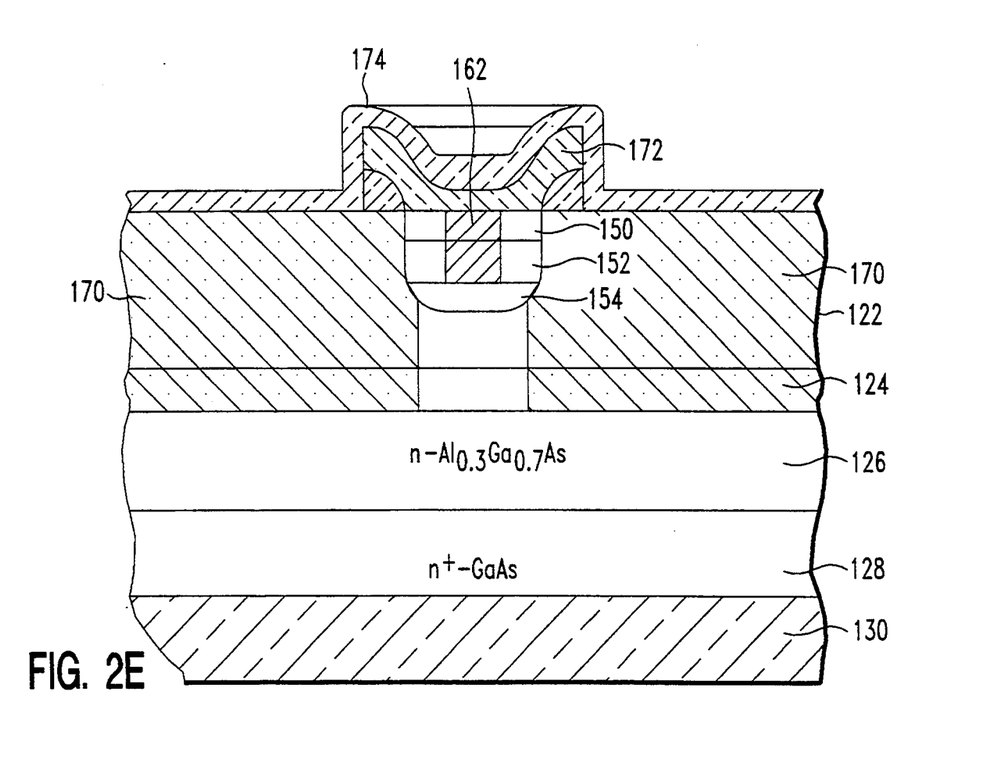

The next step is forming an extrinsic base region 170 in FIG. 2E. First, the two SiO$_2$ layers 132 and 160 are selectively etched using CF$_4$, so that the emitter, plus layers 150, 152 and 154 remain covered by SiO$_2$ portion 172. Next, a 0.1 $\mu$m SiO$_2$ third layer 174 is formed on the wafer surface 120. Then, Mg is ion-implanted into the wafer 100 at a dose of $2 \times 10^{14}$/cm$^2$ and energy level of 200 KeV to a depth of 0.35 $\mu$m. The Mg ions reach the interface of layers 124 and 126 where a new p$^{++}$-GaAs region will be formed as base region 170. As a result of Mg ion-implantation, a portion of n-type Al$_{0.3}$Ga$_{0.7}$As layer 124 also will be converted to p$^{++}$-type. However, the SiO$_2$ layers 172 and 174 mask the emitter region 140, restricting Mg ion implantation to the base 170 region. Finally, the implanted wafer 120 is annealed at 800° C. with an infra-red lamp. Annealing activates the Mg ions, forming the base region 170 p$^{++}$-type.

Figure 2F:
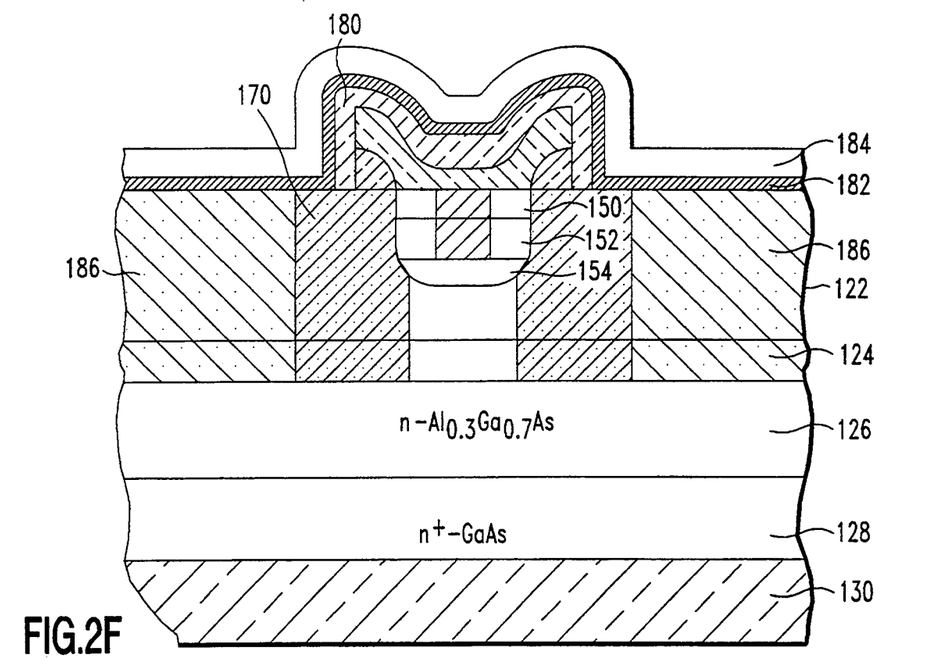

After forming the base region 170, layer 174 is etched away from the base region 170 by CF$_4$ anisotropic RIE, leaving only portion 180 in FIG. 2F. A 500Å Si$_3$N$_4$ film 182 is deposited on the wafer by Plasma-CVD (P-CVD) and a 0.2 $\mu$m thick fourth SiO$_2$ layer 184 is formed on the Si$_3$N$_4$ film 182. Boron ions are implanted at 150 KeV through the SiO$_2$ film 1184 and Si$_3$N$_4$ film 182 to a dose of $1 \times 10^{13}$ cm$^-$ to form a high resistance layer 186.

Figure 2G:
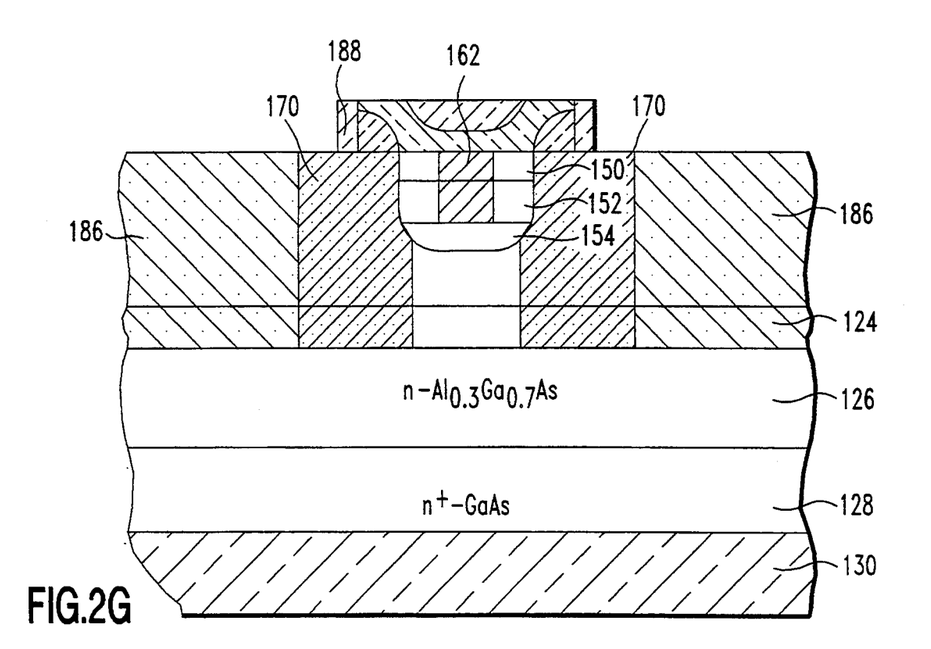

After forming the high resistance layer 186, the SiO$_2$ layer 184 is removed with buffered hydrofluoric acid and the Si$_3$N$_4$ film 182 is removed with O$_2$+CF$_4$ plasma leaving a cap 188 in FIG. 2G. Then, a portion of the SiO$_2$ cap 188 is removed by buffered hydrofluoric acid to leave the structure in FIG. 2H.

Figure 2H:
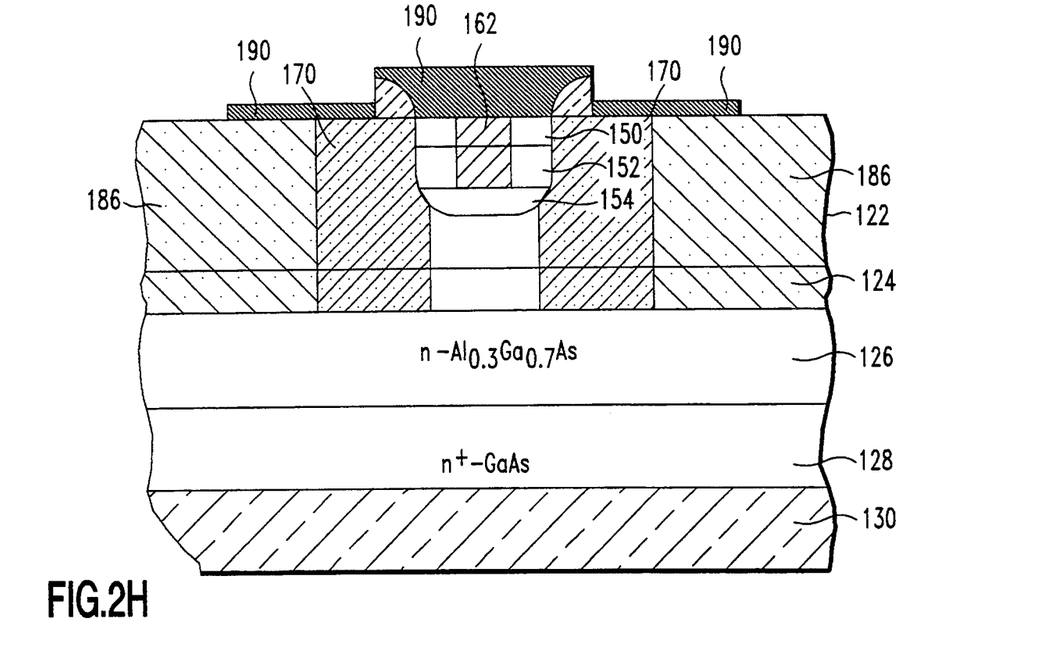
Figure 2I:
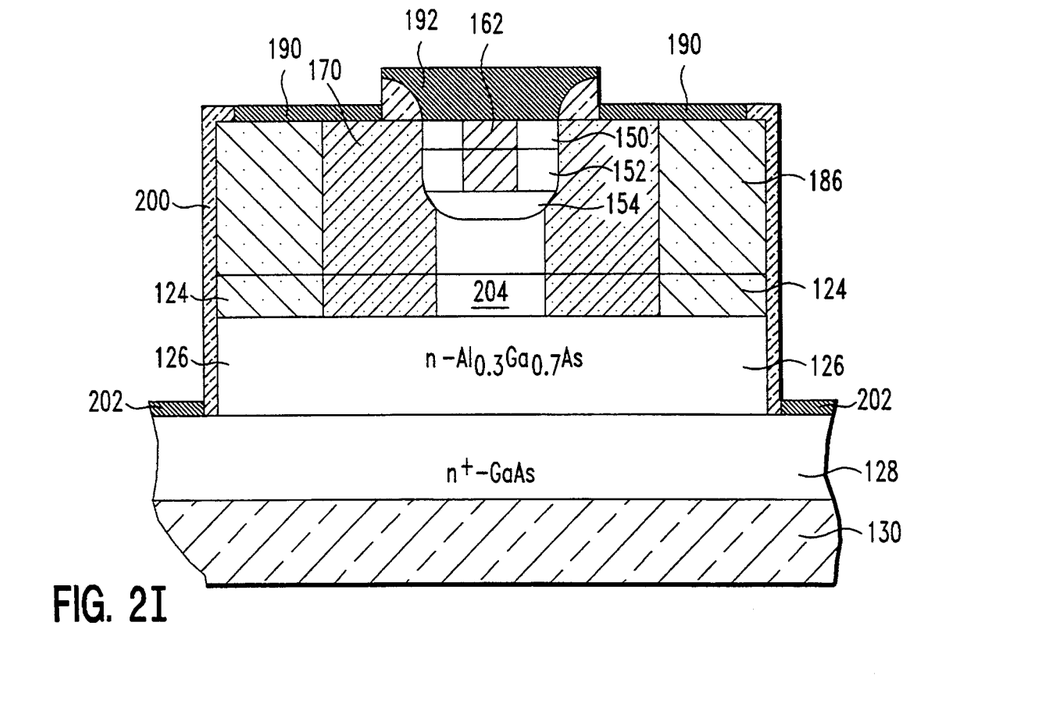

On the structure in FIG. 2H resistive electrodes are formed. The base electrode 190 is formed by depositing an AuZn alloy on the wafer and, then, etching the alloy with a mixture of iodine and potassium iodide to expose regions 170 and 186. The emitter electrode 192 is formed by removing enough SiO$_2$ to expose the extrinsic base 162 and then selectively depositing AuZn. After forming emitter electrode 192, the wafer is annealed at 400° C. so that emitter electrode 192 and n$^+$-GaAs 150 both form ohmic electrodes. The collector electrode, 202 as shown in FIG. 2I, is formed by selectively dry etching the GaAs layer 119 with a mixture of the CCl$_2$F$_2$ and H$_2$ with layer 126 acting as an etch stop. The exposed portion of Al$_{0.3}$Ga$_{0.7}$As layer 126 is wet etched using an etchant solution of NH$_4$OH—H$_2$O$_2$—H$_2$O to expose n$^+$ GaAs layer 128. A layer of 200 of SiO$_2$ is selectively deposited to mask the collector electrode 202, which is a metal alloy deposited on the exposed area of layer 128.

In the preferred embodiment of the present invention, the emitter has two regions, emitter region II 152 and emitter region I 154. These two emitter regions 152 and 154, are surrounded by heavily doped extrinsic base region 170, which is of opposite conductivity type. Consequently, the p$^{++}$-type extrinsic base 170 and n-type emitter regions 152 and 154 prevent emitter carriers (electrons) from entering the extrinsic base region 170.

Figure 3:
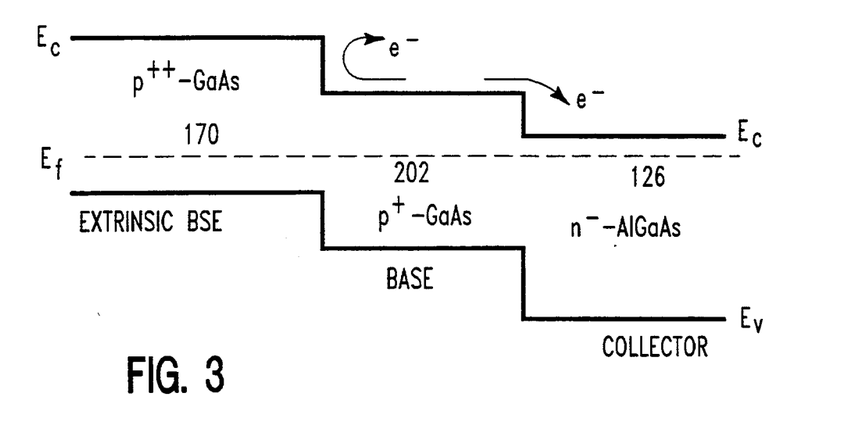
FIG. 3 is a band gap diagram for a portion of the preferred embodiment DHBT.

Additionally, the extrinsic base 170, which is far more heavily doped than the intrinsic base 204, separates the intrinsic base 204 from the SiO$_2$ surface (between the emitter and the base contact). Consequently, the extrinsic base creates the potential barrier represented in the valance band diagram of FIG. 3. Thus, when the base-collector junction is reverse biased, minority carriers are prevented from reaching the SiO$_2$ surface between the emitter and the base contact. High energy barriers at both sides force the emitter current to flow mainly through the interior portion 162 of the emitter and (intrinsic) base 204 improving both emitter efficiency and dc current gain B.

Figure 4A:
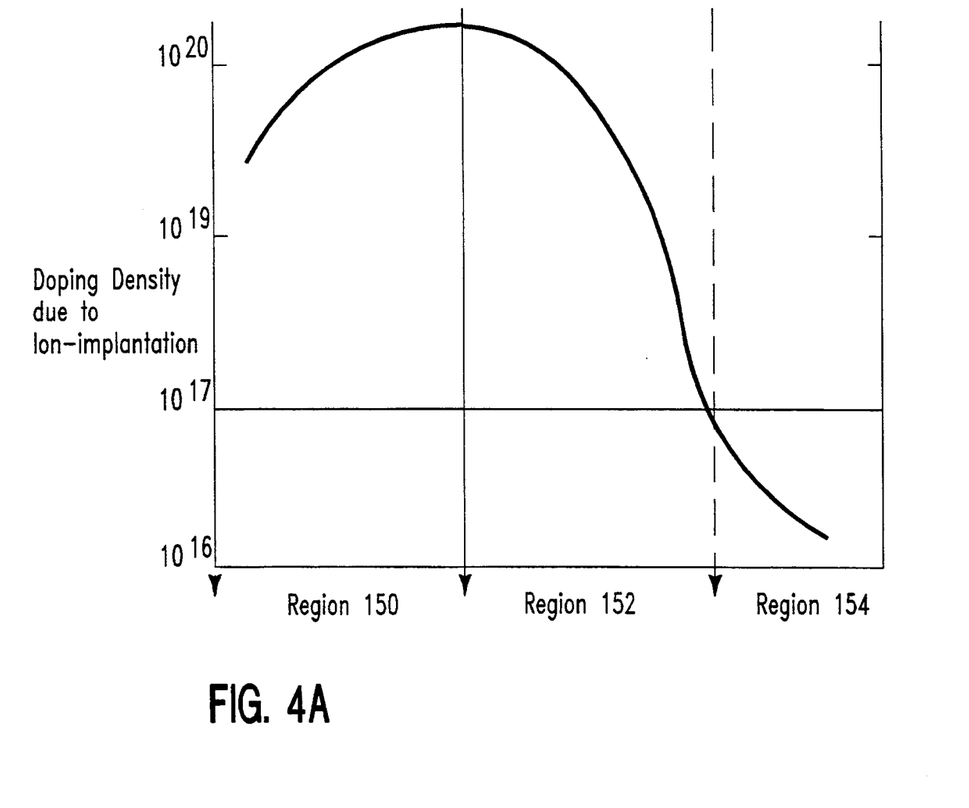
FIGS. 4A and 4B are doping profile diagrams of the preferred embodiment DHBT.
Figure 4B:
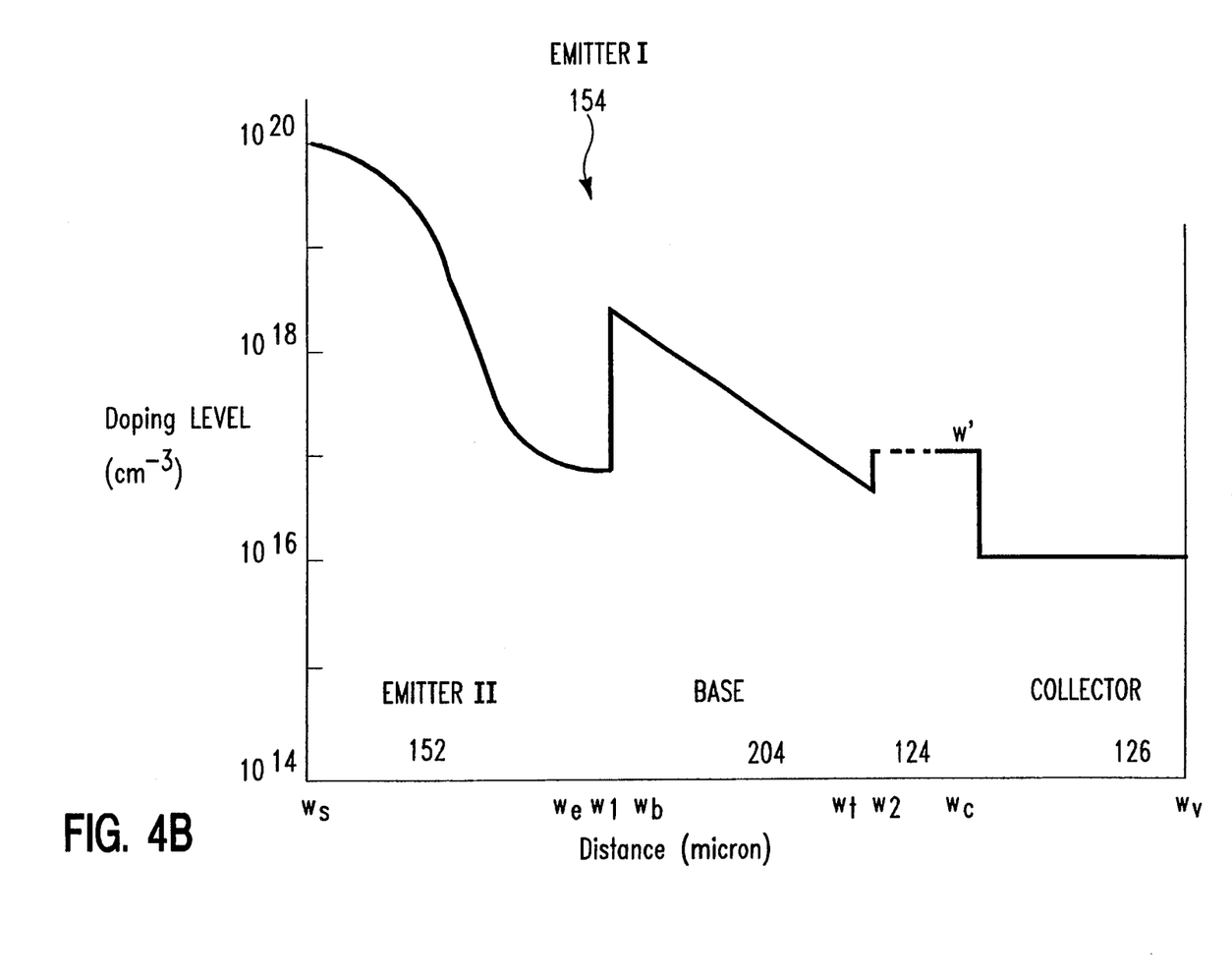

The preferred density of emitter dopant Si is provided in FIG. 4A. With the emitter ion-implanted to the dopant profile of FIG. 4A, the DHBT dopant profile of the preferred embodiment will be as in FIG. 4B. The dopant level is low in the collector region 126 (i.e., $10^{16}$ cm$^{-3}$), and high for the intrinsic base region 202 (i.e., $5 \times 10^{18}$ cm$^{-3}$).

The thin layer 124 between the base 204 and collector 126 creates an electric field at that junction. This electric field reduces the electron blocking effect that plagued prior art graded base-collector junctions. Consequently, for the preferred embodiment, almost all of the base minority carriers are swept into the collector to the collector electrode, resulting in a significant increase in collector current $I_c$ over prior art DHBT's. Also, base to emitter junction capacitance is reduced, because the depletion layer at the base-emitter junction encroaches very little of the emitter region. Base to collector capacitance is also low, because the dopant density at least in one side of the base-collector junction is low. Thus, device capacitances for the preferred embodiment DHBT have been reduced over the prior art.

While the present invention has been described in terms of a preferred embodiment, numerous modifications and alterations will occur to a person of ordinary skill in the art without departing from the scope and spirit of the invention.

I claim:

1. A Double Heterojunction Bipolar Transistor (DHBT) comprising:
   a first layer of a first semiconductor material;
   a second layer on said first layer, said second layer of a second semiconductor material;
   a third layer on said second layer, said third layer of said second semiconductor material;
   a fourth layer on said third layer, said fourth layer of said first semiconductor material;
   a layered plug in said trench, said layered plug having a highly doped core region said trench being filled by said layered plug.

2. The DHBT of claim 1 wherein said layered plug comprises:
   a bottom layer of said second semiconductor material;
   a middle layer of said second semiconductor material on said bottom layer; and
   a top layer of said first semiconductor material on said middle.

3. The DHBT of claim 2 wherein the first semiconductor material is GaAs and the second semiconductor material is AlGaAs.

4. The DHBT of claim 3 further wherein said first layer includes a first donor type dopant, said second layer includes said first dopant type at a first dopant concentration, said third layer includes said first dopant type at a second dopant concentration, and said fourth layer includes a second dopant type.

5. The DHBT of claim 4 wherein said layered plug includes said first donor type dopant.

6. The DHBT of claim 5 wherein aid layered plug dopant has a peak concentration in said middle layer of said layered plug.

7. The DHBT of claim 6 wherein said third layer includes an area with said second donor type dopant and said fourth layer includes a highly doped region adjacent to a sidewall of said plug.

8. The DHBT of claim 7 wherein said first donor type is n-type and said second donor type is p-type.

9. The DHBT of claim 7 further comprising a vertical sidewall adjacent said second, third and fourth layers.

10. The DHBT of claim 5 wherein said plug is an emitter, said fourth layer is a base and said first and said second layers are a collector.

* * * * *